United States Patent
Ko et al.

(10) Patent No.: US 9,190,583 B2
(45) Date of Patent: *Nov. 17, 2015

(54) WHITE LIGHT EMITTING DEVICE AND DISPLAY APPARATUS

(71) Applicant: SAMSUNG ELECTRONICS CO., LTD., Suwon-si (KR)

(72) Inventors: Kun Yoo Ko, Hwaseong-si (KR); Masaaki Sofue, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/558,323

(22) Filed: Dec. 2, 2014

(65) Prior Publication Data

US 2015/0085529 A1   Mar. 26, 2015

Related U.S. Application Data

(63) Continuation of application No. 13/868,628, filed on Apr. 23, 2013, now Pat. No. 8,928,220.

(30) Foreign Application Priority Data

Apr. 23, 2012   (KR) .................. 10-2012-0042228

(51) Int. Cl.
*H01L 33/50* (2010.01)
*H05B 33/12* (2006.01)
*C09K 11/06* (2006.01)
*F21V 8/00* (2006.01)
*H01L 33/52* (2010.01)

(52) U.S. Cl.
CPC .............. *H01L 33/504* (2013.01); *C09K 11/06* (2013.01); *G02B 6/0068* (2013.01); *G02B 6/0073* (2013.01); *H01L 33/52* (2013.01); *H05B 33/12* (2013.01)

(58) Field of Classification Search
CPC ...... H05B 33/12; G02B 6/0068; G02B 6/003; C09K 11/06
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |

(Continued)

OTHER PUBLICATIONS

Notice of Allowance for U.S. Appl. No. 13/868,628 mailed Sep. 3, 2014.

*Primary Examiner* — Mary Ellen Bowman
(74) *Attorney, Agent, or Firm* — Sughrue Mion, PLLC (57) ABSTRACT

A white light emitting device includes: a blue light emitting diode (LED) which emits blue light; and a resin packing unit which encapsulates the blue LED, wherein the resin packing unit includes a first wavelength conversion material which, in response to being excited by the blue light, emits green light, a second wavelength conversion material which, in response to being excited by the blue light, emits red light, and a complex compound which absorbs light of a region in which the green light and the red light are mixed, the light of the region being included in white light implemented through a mixture of the green light and the red light excited together with the blue light.

20 Claims, 7 Drawing Sheets

(56) References Cited

U.S. PATENT DOCUMENTS

| | | |
|---|---|---|
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,888,691 B2 | 2/2011 | Krames |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2006/0194020 A1 | 8/2006 | Naito et al. |
| 2006/0292462 A1 | 12/2006 | Seo et al. |
| 2008/0105887 A1 | 5/2008 | Narendran et al. |
| 2008/0218068 A1 | 9/2008 | Cok |
| 2012/0155115 A1 | 6/2012 | Jang |

WHITE LIGHT EMITTING DEVICE AND DISPLAY APPARATUS

CROSS-REFERENCE TO RELATED APPLICATION

This application is a continuation of U.S. application Ser. No. 13/868,628 filed on Apr. 23, 2013, which claims priority to Korean Patent Application No. 10-2012-0042228 filed on Apr. 23, 2012, in the Korean Intellectual Property Office, the disclosure of which is incorporated herein by reference in its entirety.

BACKGROUND

1. Field

The present disclosure relates to a white light emitting device and, more particularly, to a white light emitting device providing white light having excellent color characteristics and a display apparatus using the same.

2. Description of the Related Art

A light emitting diode (LED), which is a device that converts electricity into light by using the properties of a compound semiconductor, has been variably used and developed as a next-generation light source. LEDs are highly advantageous in terms of color expression and power consumption, and as such, LEDs have come to prominence as a light source that may be able to replace a conventional cold cathode fluorescent lamp (CCFL) used in a backlight unit (BLU) of a notebook computer, a TV, and the like.

In particular, white light emitting devices have mainly been used in a backlight unit or in various other illumination devices. In order to implement a white light emitting device, a first method includes molding a blue LED chip and applying a yellow phosphor thereto. A second method includes implementing a white light emitting device by using a blue LED chip, a green LED chip, and a red LED chip in concert. In a third method, phosphors such as a red (R) phosphor, a green (G) phosphor, a blue (B) phosphor, and the like, are mixed with a resin such as silicon or the like, and applied to a blue LED chip to implement white light. This third method has recently been widely used. The obtained white light is required to satisfy the demand for various color characteristics in displays or illumination devices.

SUMMARY

In the art of LED technology, there is a need for a white light emitting device having excellent color reproducibility (or a color gamut) and a display apparatus using the same.

According to an aspect of an exemplary embodiment, there is provided a white light emitting device including: a blue light emitting diode (LED) which emits blue light; and a resin packing unit which encapsulates the blue LED, wherein the resin packing unit includes a first wavelength conversion material which, in response to being excited by the blue light, emits green light, a second wavelength conversion material which, in response to being excited by the blue light, emits red light, and a complex compound which absorbs light of a region in which the green light and the red light are mixed, the light of the region being included in white light implemented through a mixture of the green light and the red light excited together with the blue light.

The blue light emitted from the blue LED may have a peak wavelength ranging from 430 nm to 460 nm.

The white light may have a first peak wavelength in a wavelength band ranging from 525 nm to 545 nm and a second peak wavelength in a wavelength band ranging from 615 nm to 650 nm.

The complex compound may absorb light having a wavelength ranging from 550 nm to 610 nm.

The complex compound may absorb light having a wavelength ranging from 580 nm to 590 nm.

The complex compound may have the following structural formula:

According to another aspect of an exemplary embodiment, there is provided a white light emitting device including: a blue light emitting diode (LED) which emits blue light having a peak wavelength ranging from 430 nm to 460 nm; a first wavelength conversion material which, in response to being excited by the blue light, emits green light; a second wavelength conversion material which, in response to being excited by the blue light, emits red light, wherein white light obtained from a mixture of the green light and the red light excited together with the blue light has a first peak wavelength in a wavelength band ranging from 525 nm to 545 nm and a second peak wavelength in a wavelength band ranging from 615 nm to 650 nm; and a complex compound made of a material which absorbs light between the first and second peak wavelengths.

The complex compound may absorb light having a wavelength ranging from 550 nm to 610 nm.

The complex compound may absorb light having a wavelength ranging from 580 nm to 590 nm.

The complex compound may have the following structural formula:

According to another aspect of an exemplary embodiment, there is provided a white light emitting device including: a blue light emitting diode (LED) which emits blue light; a wavelength conversion material which, in response to being excited by the blue light, emits light, wherein white light obtained from a mixture of the light excited together with the blue light has a first peak wavelength in a wavelength band ranging from 525 nm to 545 nm and a second peak wavelength in a wavelength band ranging from 615 nm to 650 nm; and a complex compound made of a material which absorbs light between the first and second peak wavelengths.

The blue light may have a peak wavelength ranging from 430 nm to 460 nm.

The complex compound may absorb light having a wavelength ranging from 550 nm to 610 nm.

The complex compound may absorb light having a wavelength ranging from 580 nm to 590 nm.

The complex compound may have the following structural formula:

According to another aspect of an exemplary embodiment, there is provided a display apparatus including the white light emitting device according to an exemplary embodiment.

According to another aspect of an exemplary embodiment, there is provided a display apparatus including: a light emitting diode (LED) light source module which emits light; and an image display panel which receives the light from the LED light source module irradiated thereto and which displays an image, wherein the LED light source module includes a printed circuit board and the white light emitting device according to an exemplary embodiment on a printed circuit board.

According to another aspect of an exemplary embodiment, there is provided a light emitter including a blue light emitting diode (LED) which emits blue light, and a wavelength converter which converts a portion of the blue light into non-blue light, wherein the blue light and the non-blue light are combined to produce white light, the white light having a plurality of intensity peaks at a corresponding plurality of wavelengths, and wherein the light emitter further comprises an intensity reducing material which reduces an intensity of a portion of the white light between two of the intensity peaks.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EXEMPLARY EMBODIMENTS

Exemplary embodiments of the present disclosure will now be described in detail with reference to the accompanying drawings. The exemplary embodiments may, however, be embodied in many different forms and should not be construed as being limited to the exemplary embodiments set forth herein. Rather, these exemplary embodiments are provided so that this disclosure will be thorough and complete, and will fully convey the scope of the exemplary embodiments to those skilled in the art. In the drawings, the shapes and dimensions of elements may be exaggerated for clarity, and the same reference numerals will be used throughout to designate the same or like components.

In general, according to exemplary embodiments, a 'color gamut' of a light emitting device refers to a portion of a color space that may be generated by the light emitting device.

Figure 1:
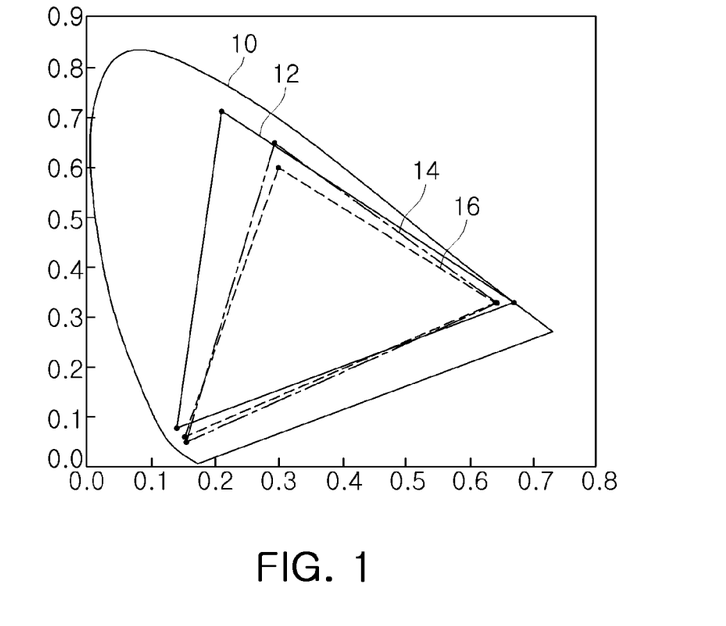
FIG. 1 is a graph showing color gamuts of an NTSC standard and a white light emitting device.

FIG. 1 is a graph showing color gamuts of an NTSC standard and a white light emitting device.

As shown in FIG. 1, a region 10 is a CIE 1931 chromaticity diagram as a mathematical expression of every color. The mostly outermost triangle 12 is the gamut for National Television System Committee (NTSC), a color standard for a television. The mostly inner triangle 14 is the gamut for a white light emitting device. A further inner triangle 16 is a region representing standard RGB (sRGB).

According to exemplary embodiments, in a white light emitting device for backlighting, a resin packing unit (or a resin encapsulant) may include a wavelength conversion material which emits green light, a wavelength conversion material which emits red light, and a complex compound which absorbs light having a certain wavelength.

Figure 2:
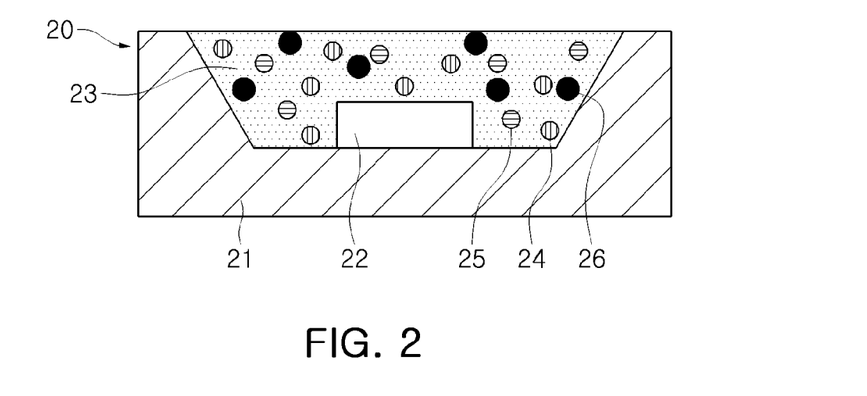
FIG. 2 is a schematic view of a white light emitting device according to an exemplary embodiment.

FIG. 2 is a schematic view of a white light emitting device according to an exemplary embodiment.

As shown in FIG. 2, a white light emitting device 20 includes a package main body 21 having a reflective cup formed at the center thereof, a blue LED 22 mounted on a bottom surface of the reflective cup, and a resin packing unit 23 formed in the reflective cup to encapsulate the blue LED.

The resin packing unit 23 may be made of a silicon resin, an epoxy resin, or a combination thereof. In the present exemplary embodiment, the resin packing unit 23 may include a first wavelength conversion material 24 which is excited by blue light and which emits green light in response to being excited by the blue light, and a second wavelength conversion material 25 which is excited by blue light and which emits red light in response to being excited by the blue light. At least one of the first and second wavelength conversion materials 24 and 25 may be a ceramic phosphor or a semiconductor quantum dot. Also, the resin packing unit 23 ay include a complex compound 26 that absorbs light from a region in which red and green are mixed (or a red-green mixture region).

Figure 3:
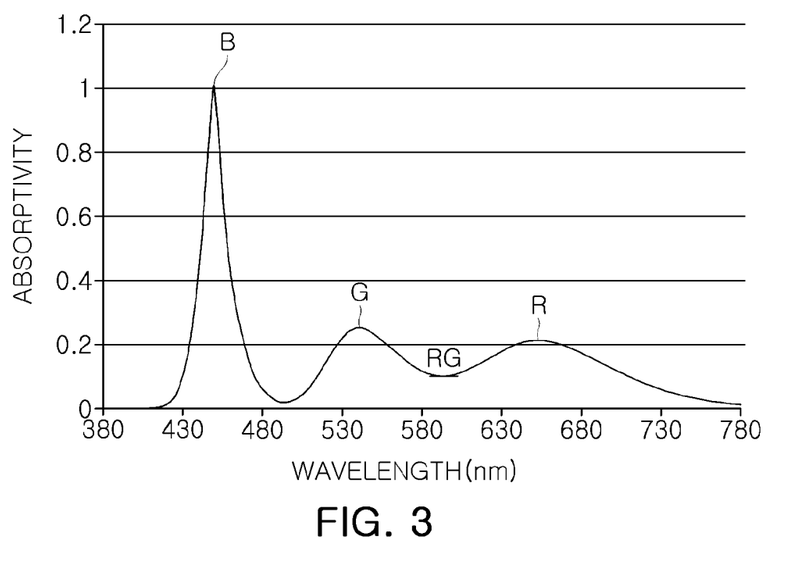
FIG. 3 is a graph showing a spectrum of white light emitted from the white light emitting device according to an exemplary embodiment.

FIG. 3 is a graph showing a spectrum of white light emitted from the white light emitting device according to an exemplary embodiment.

In the present exemplary embodiment, blue light from the blue LED 22 has a peak wavelength ranging from 430 nm to 460 nm. White light obtained from a mixture of the red and green light excited together with the blue light may have a first peak wavelength G in a wavelength band ranging from 525 nm to 545 nm and a second peak wavelength R in a wavelength band ranging from 615 nm to 650 nm.

The wavelength region between the first and second peak wavelengths G and R is called a "red-green mixture region" or a "color mixture region".

In the present exemplary embodiment, the complex compound 26 that absorbs light is mixed in the resin packing unit 23 to absorb light having a wavelength corresponding to the red-green mixture region. Thus, color reproducibility can be remarkably enhanced by lowering the relative intensity RG of the red-green mixture region. In addition, LCD transmissivity of a display apparatus can be considerably enhanced, resulting in an increase in efficiency.

In general, the red-green mixture region is a region in which respective converted light beams converted by the first and second wavelength conversion materials overlap, so setting low intensity in the region is conventionally difficult, but in the present exemplary embodiment, the resin packing unit 23 is implemented to include the complex compound 26 that absorbs particular beams of light.

According to an exemplary embodiment, the complex compound 26 that absorbs light may be made of a light absorption material, e.g., TAP by Yamada Chemical Co., Ltd. The TAP material may be implemented as various TAPs from TAP-2 to TAP-45. The complex compound 26 has the following structural formula.

<Structural Formula of Complex Compound>

Figure 4:
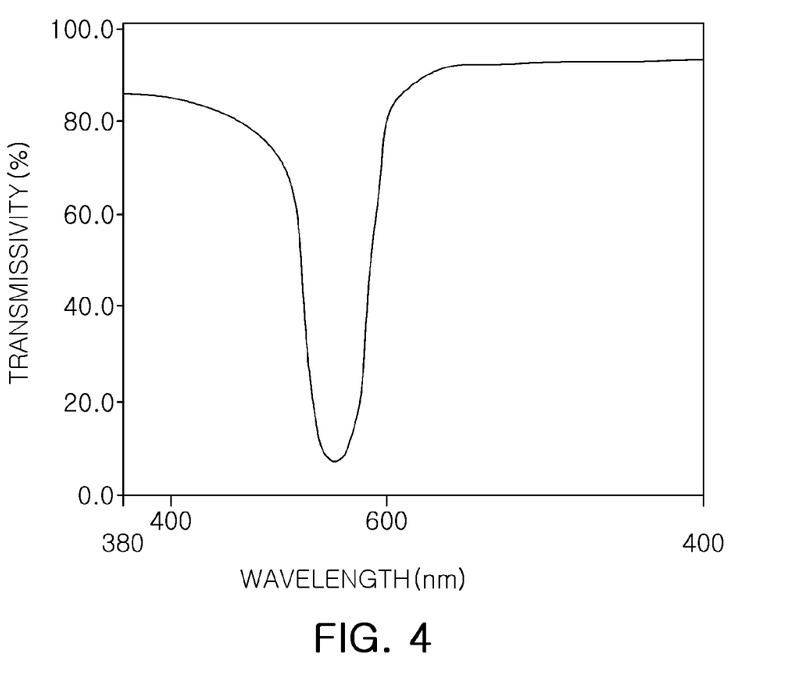
FIG. 4 is a graph of transmissivity (or a transmission rate) over a wavelength of a complex compound according to an exemplary embodiment.
Figure 5:
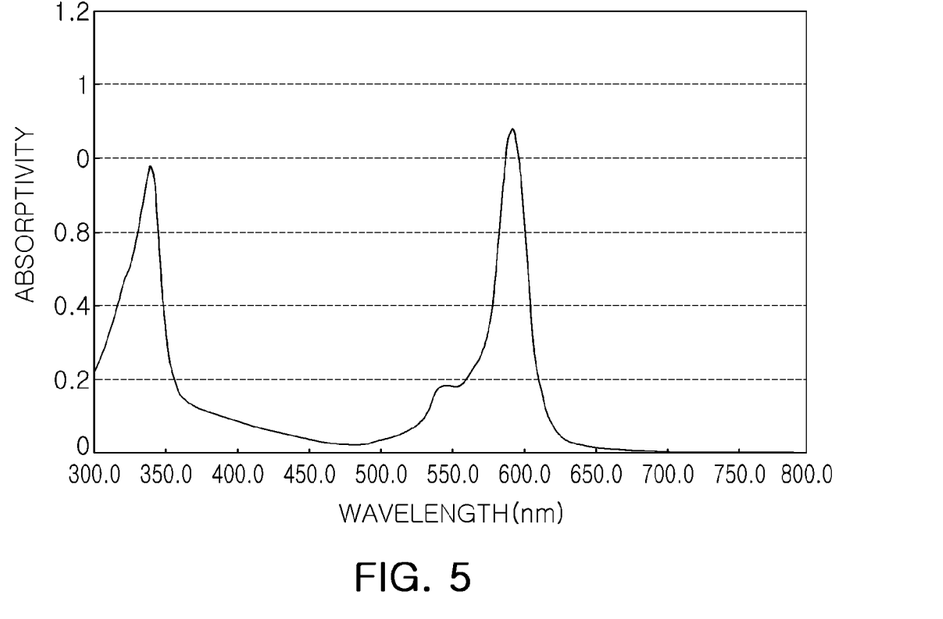
FIG. 5 is a graph of absorptivity (or an absorption rate) over a wavelength of a complex compound according to an exemplary embodiment.

FIG. 4 is a graph of transmissivity over a wavelength range of a complex compound according to an exemplary embodiment, and FIG. 5 is a graph of absorptivity over a wavelength of a complex compound according to an exemplary embodiment.

As shown in FIGS. 4 and 5, the complex compound according to an exemplary embodiment absorbs light having a wavelength region ranging from 550 nm to 610 nm. In particular, the complex compound absorbs light having a wavelength region ranging from 580 nm to 590 nm.

Thus, the complex compound absorbs light having the wavelength corresponding to the 'color mixture region', also known as the red-green mixture region, thereby lowering the relative intensity (RG) of the 'color mixture region', thus considerably enhancing color reproducibility.

Hereinafter, an operation and effect of an exemplary embodiment will be described in detail below.

Exemplary Embodiment

In the present exemplary embodiment, a first wavelength conversion material which, in response to being excited by blue light, emits green light, a second wavelength conversion material which, in response to being excited by blue light, emits red light, and a complex compound that absorbs light of a red-green mixture region were prepared in a resin packing unit and applied to a blue LED having a wavelength of 455 nm to fabricate a white light emitting device having a structure such as that illustrated in FIG. 2.

Comparative Example

In a comparative example, a first wavelength conversion material configured to be excited by blue light and to thereby emit green light and a second wavelength conversion material configured to be excited by blue light and to thereby emit red light were prepared in a resin packing unit and applied to a blue LED having a wavelength of 455 nm to fabricate a white light emitting device having a structure similar to the structure illustrated in FIG. 2, except without a complex compound that absorbs light of a red-green mixture region.

Figure 6:
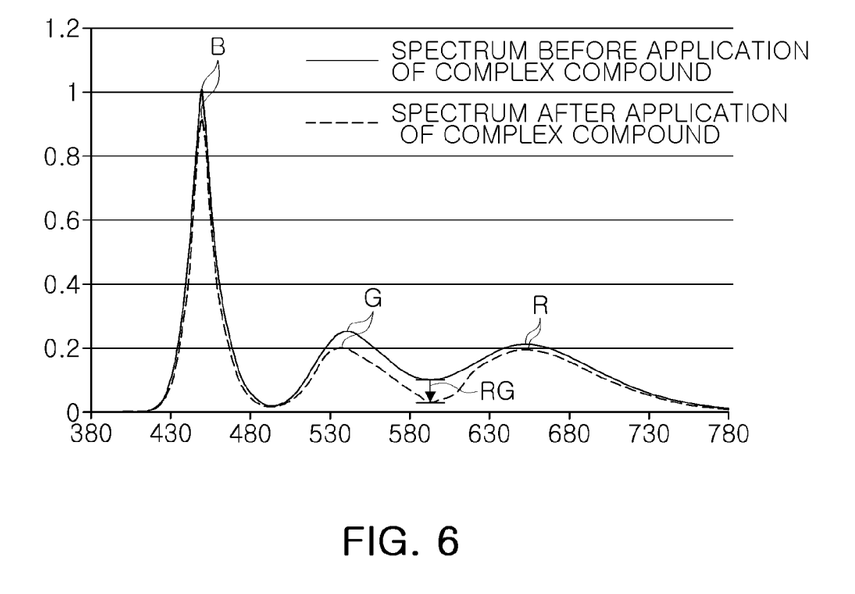
FIG. 6 is a graph showing spectrums of white light emitted from the white light emitting devices according to an exemplary embodiment and a comparative example.

Spectrums of white light emitted from the white light emitting devices according to an exemplary embodiment and comparative example are illustrated in FIG. 6.

As shown in FIG. 6, it can be seen that the relative intensity RG between green and red was lowered by using the light emitting device according to an exemplary embodiment.

Next, color coordinates and color reproducibility of white light emitted from the white light emitting devices according to an exemplary embodiment and comparative example were measured over the sRGB area and NTSC area. The results of the measurements are shown in Table 1 below.

TABLE 1

| Classification | Color coordinates | | Color reproducibility (over sRGB) | Color reproducibility (over NTSC) |
| --- | --- | --- | --- | --- |
| | Cx | Cy | | |
| Embodiment | 0.259 | 0.2761 | 99.99% | 82.32% |
| Comparative example | 0.264 | 0.2685 | 99.76% | 74.52% |

Figure 7:
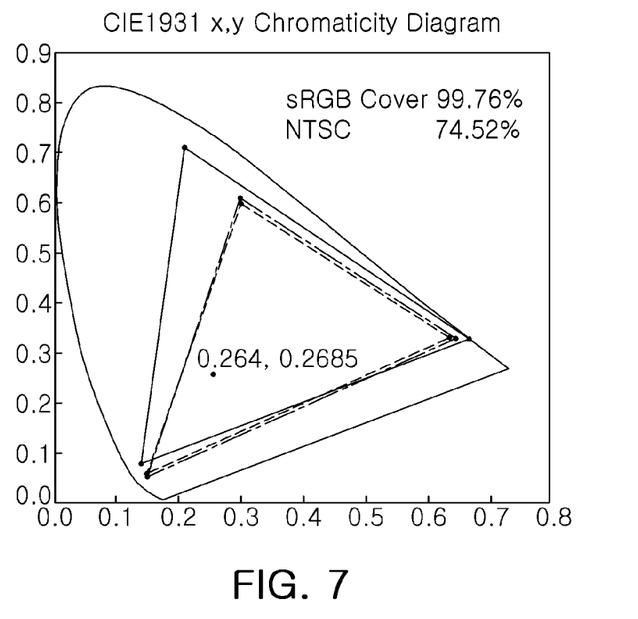
FIG. 7 is a graph showing a color gamut of a white light emitting device according to the comparative example.
Figure 8:
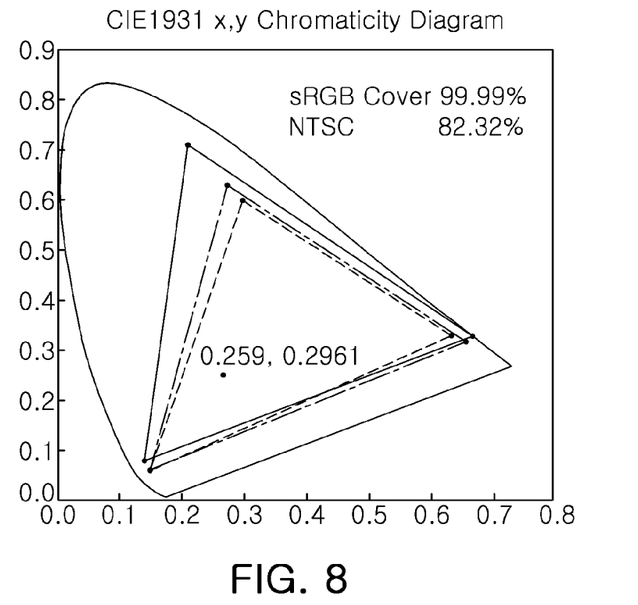
FIG. 8 is a graph showing a color gamut of a white light emitting device according to an exemplary embodiment.

FIG. 7 is a graph showing a color gamut of a white light emitting device according to the comparative example, and FIG. 8 is a graph showing a color gamut of a white light emitting device according to an exemplary embodiment.

As shown in FIGS. 7 and 8 and Table 1, it can be seen that the color reproducibility of the white light emitting device according to an exemplary embodiment over the NTSC area was increased to 82.32%, which is approximately 8% greater than the 74.52% color reproducibility of the comparative example.

Thus, color reproducibility can be significantly enhanced by lowering the relative intensity RG corresponding to the red-green mixture region. In addition, LCD transmissivity of a display apparatus can be considerably enhanced, thereby resulting in an increase of efficiency.

Figure 9:
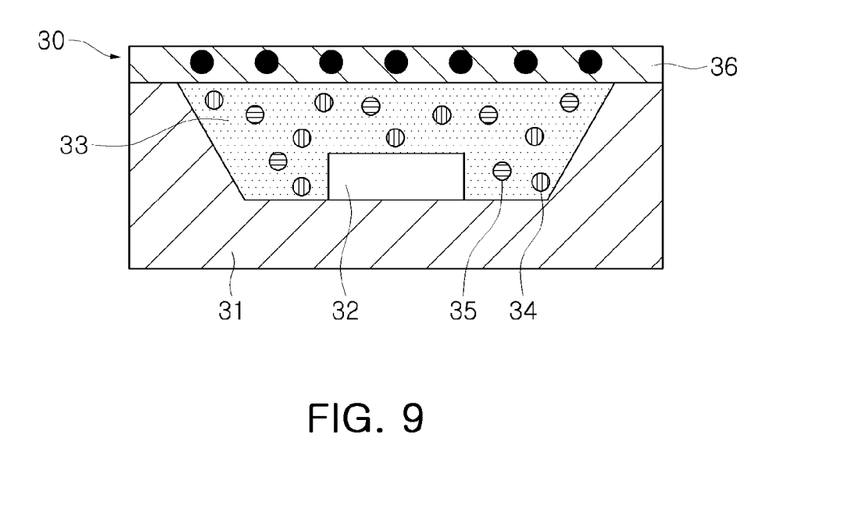
FIGS. 9 and 10 are schematic views of white light emitting devices according to various exemplary embodiments.
Figure 10:
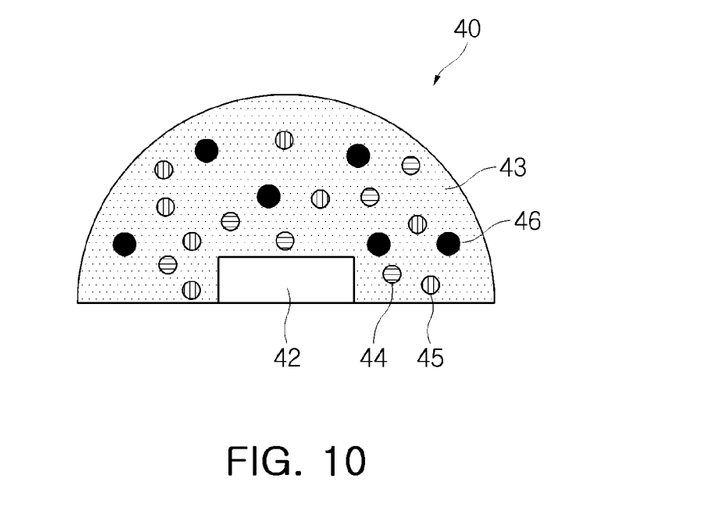

Unlike the configuration illustrated in FIG. 2, various other light emitting devices may be implemented according to other exemplary embodiments. Such implementation examples are illustrated in FIGS. 9 and 10. Various examples and application forms of white light emitting devices according to exemplary embodiments will be described with reference to FIGS. 9 and 10.

A white light emitting device 30 illustrated in FIG. 9 includes a package main body 31 having a reflective cup formed at the center thereof, a blue LED 32 mounted on the bottom of the reflective cup, and a resin packing unit 33 formed in the reflective cup to encapsulate the blue LED 32.

The resin packing unit 33 may include a first wavelength conversion material 34 configured to be excited by blue light and to thereby emit green light and a second wavelength conversion material 35 configured to be excited by blue light and to thereby emit red light. At least one of the first and second wavelength conversion materials 34 and 35 may be a ceramic phosphor or a semiconductor quantum dot. Also, a complex compound layer 36 including a complex compound that absorbs light of a red-green mixture region may be formed as a film and attached to the resin packing unit 33.

A white light emitting device 40 illustrated in FIG. 10 includes a blue LED 42 and a resin packing unit 43 packing the blue LED 42 and having a shape of an upwardly convex lens.

The resin packing unit 43 may include a first wavelength conversion material 44 configured to be excited by blue light and to thereby emit green light and a second wavelength conversion material 45 configured to be excited by blue light and to thereby emit red light. At least one of the first and second wavelength conversion materials 44 and 45 may be a ceramic phosphor or a semiconductor quantum dot. Also, the resin packing unit 43 includes a complex compound 46 that absorbs light of a red-green mixture region.

The resin packing unit 43 may have a shape of a hemispherical lens in order to secure a wide orientation angle. The blue LED 42 may be directly mounted on a circuit board. The resin packing unit 43 may be made of a silicon resin, an epoxy resin, or a combination thereof.

As described above, the wavelength conversion materials and the complex compound may be implemented in various manners and combinations. It is noted that, when the wavelength conversion material is implemented as a semiconductor quantum dot, if the wavelength conversion material is in contact with the atmosphere, characteristics thereof may be greatly degraded, and a hermetically closed structure may be therefore be employed to prevent degradation.

According to various exemplary embodiments, the configuration of employing two wavelength conversion materials including the wavelength conversion material which emits green light and the wavelength conversion material which emits red light are illustrated, but three wavelength conversion materials which respectively emit green light, blue light, and red light may be used according to other exemplary embodiments in appropriate circumstances. Also, various other combinations of a plurality of wavelength conversion materials may be used according to other exemplary embodiments in appropriate circumstances.

Figure 11A:
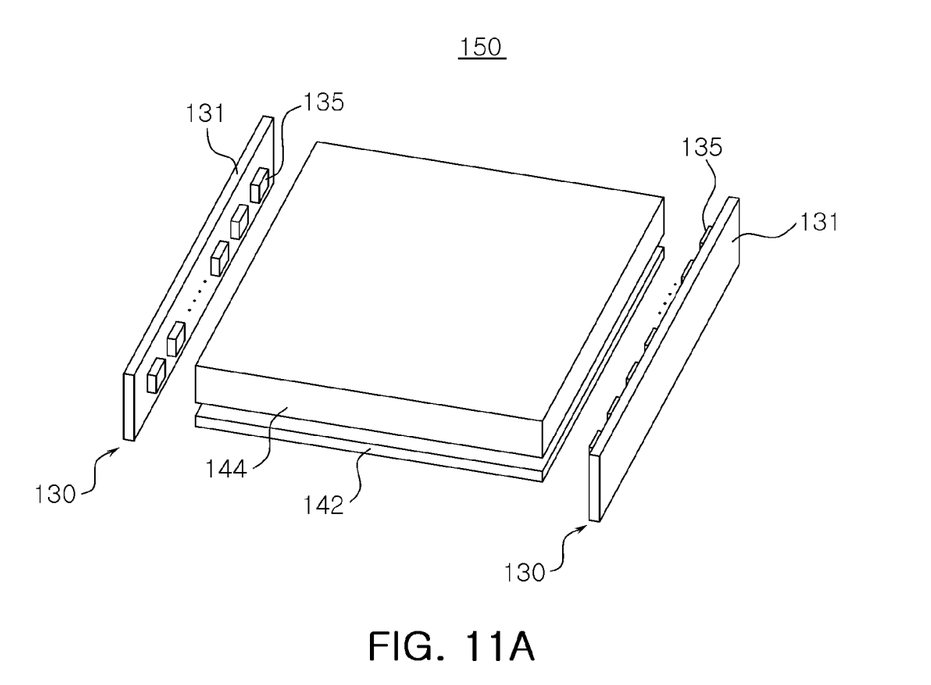
FIGS. 11A and 11B are schematic views illustrating various backlight units that may be employed in a display apparatus according to an exemplary embodiment.
Figure 11B:
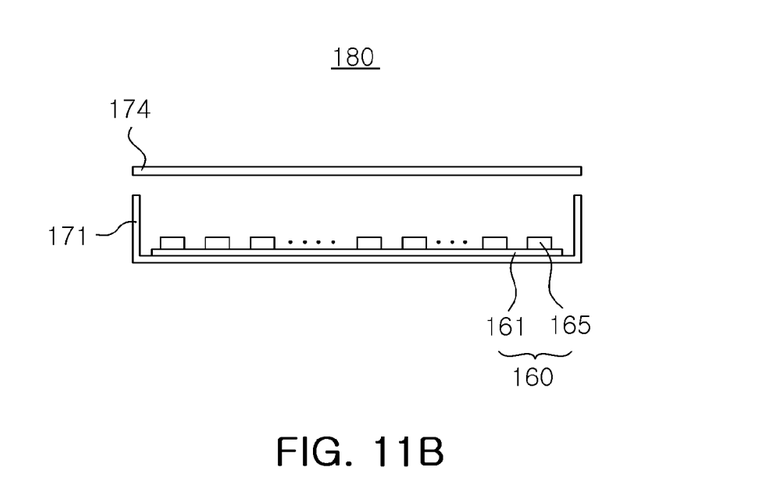

FIGS. 11A and 11B are schematic views illustrating various backlight units that may be employed in a display apparatus according to an exemplary embodiment.

With reference to FIG. 11A, an edge type backlight unit 150 is illustrated as an example of a backlight unit to which a white light emitting device according to an exemplary embodiment may be applicable as a light source.

The edge type backlight unit 150 may include a light guide plate 144 and LED light source modules 130 provided at both sides of the light guide plate 144.

In an exemplary embodiment, the LED light source modules 130 are provided on both opposing lateral surfaces of the light guide plate 144, but the exemplary embodiments are not limited thereto and the LED light source module 130 may only be provided on one lateral surface of the light guide plate 144 or an additional LED light source module or modules 130 may be provided on a different lateral surface of the light guide plate 144.

As shown in FIG. 11A, a reflective plate 142 may be provided under the light guide plate 144. The LED light source modules 130 employed according to an exemplary embodiment may include a printed circuit board 131 and a plurality of LED light sources 135 mounted on an upper surface of the substrate 131. The LED light sources 135 may be the white light emitting devices according to exemplary embodiments, as described above.

With reference to FIG. 11B, a direct type backlight unit 180 is illustrated as an example of a different type of backlight unit.

The direct type backlight unit 180 according to an exemplary embodiment may include a light diffusion plate 174 and LED light source modules 160 arranged under the light diffusion plate 174.

The backlight unit 180 illustrated in FIG. 11B may include a bottom case 171 formed below the light diffusion plate 174 to accommodate the light source modules 160.

The LED light source modules 160 employed in an exemplary embodiment include a printed circuit board (PCB) 161 and a plurality of LED light sources 165 mounted on an upper surface of the PCB 161. The plurality of LED light sources 165 may be the white light emitting devices according to exemplary embodiments as described above.

Figure 12:
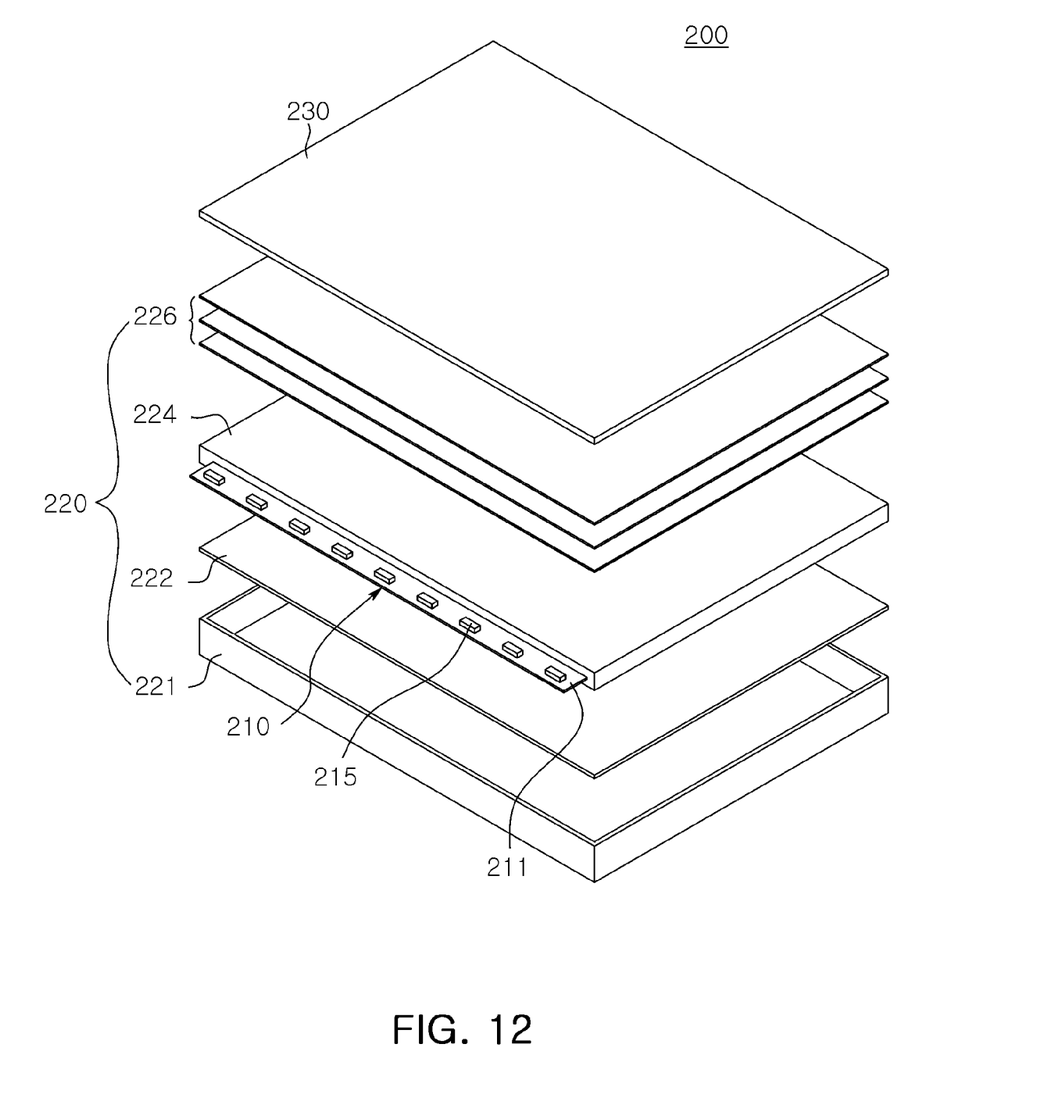
FIG. 12 is an exploded perspective view of an LED display apparatus according to an exemplary embodiment.

FIG. 12 is an exploded perspective view of a display apparatus according to an exemplary embodiment.

A display apparatus 200 illustrated in FIG. 12 includes a backlight unit 220 and an image display panel 230 such as a liquid crystal panel, or the like. The backlight unit 220 includes a light guide plate 224 and an LED light source module 210 provided on at least one lateral surface of the light guide plate 224.

In an exemplary embodiment, as illustrated, the backlight unit 220 may further include a bottom case 221 and a reflective plate 222 positioned beneath the light guide plate 224.

Also, various types of optical sheets 226 such as a diffusion sheet, a prism sheet, protective sheet, or the like, may be provided between the light guide plate 224 and the liquid crystal panel 230 according to a demand for various optical characteristics.

The LED light source module 210 may include a PCB 211 and a plurality of LED light sources 215 mounted on the PCB 211 to output light to the light guide plate 224. The plurality of LED light sources 215 may be the white light emitting devices according to exemplary embodiments as described above. The plurality of LED light sources 215 employed in an exemplary embodiment may be implemented as a side view type light emitting device package in which the light sources are mounted on lateral surfaces adjacent to a light output surface.

The white light emitting device including the wavelength conversion materials and complex compound according to exemplary embodiments, as described above, may be applicable to various types of LED light source modules. The foregoing light emitting device or a light source module including the same may be applicable to various types of display apparatuses.

As set forth above, according to exemplary embodiments, by lowering a peak intensity of the color mixture region, color reproducibility can be enhanced and LCD transmissivity of the display apparatus can be significantly enhanced.

While the present disclosure has been shown and described in connection with the exemplary embodiments, it will be apparent to those skilled in the art that modifications and variations can be made without departing from the spirit and scope of the exemplary embodiments as defined by the appended claims.

What is claimed is:

1. A light emitter, comprising:
a blue light emitting diode (LED) which emits blue light; and
a wavelength converter which converts a portion of the blue light into non-blue light;
wherein the blue light and the non-blue light are combined to produce white light, the white light having a plurality of intensity peaks at a corresponding plurality of wavelengths; and
wherein the light emitter further comprises an intensity reducing material which reduces an intensity of a portion of the white light between two of the intensity peaks.

2. The light emitter of claim 1, wherein the intensity reducing material comprises a compound represented by Formula 1:

[Formula 1]

3. The light emitter of claim 1, wherein the blue light emitted from the blue LED has a peak wavelength ranging from 430 nm to 460 nm.

4. The light emitter of claim 1, wherein the two intensity peaks comprise a first intensity peak in a wavelength band ranging from 525 nm to 545 nm and corresponding to green light, and a second intensity peak in a wavelength band ranging from 615 nm to 650 nm and corresponding to red light.

5. The light emitter of claim 1, wherein the intensity reducing material absorbs light having a wavelength ranging from 550 nm to 610 nm.

6. The light emitter of claim 1, wherein the intensity reducing material absorbs light having a wavelength ranging from 580 nm to 590 nm.

7. The light emitter of claim 1, wherein the wavelength converter includes ceramic phosphor.

8. The light emitter of claim 1, wherein the wavelength converter includes a quantum dot.

9. A display apparatus comprising a white light emitting device, the white light emitting device comprising:
a blue light emitting diode (LED) which emits blue light; and
a resin packing unit which encapsulates the blue LED,
wherein the resin packing unit includes a first wavelength conversion material which, in response to being excited by the blue light, emits green light, a second wavelength conversion material which, in response to being excited by the blue light, emits red light, and a complex compound which absorbs light of a region in which the green light and the red light are mixed, the light of the region being included in white light implemented through a mixture of the green light and the red light excited together with the blue light.

10. The display apparatus of claim 9, wherein the blue light emitted from the blue LED has a peak wavelength ranging from 430 nm to 460 nm.

11. The display apparatus of claim 9, wherein the white light has a first peak wavelength in a wavelength band ranging from 525 nm to 545 nm and a second peak wavelength in a wavelength band ranging from 615 nm to 650 nm.

12. The display apparatus of claim 9, wherein the complex compound absorbs light having a wavelength ranging from 550 nm to 610 nm.

13. The display apparatus of claim 9, wherein the complex compound absorbs light having a wavelength ranging from 580 nm to 590 nm.

14. The display apparatus of claim 9, wherein the complex compound comprises a compound represented by Formula 1:

[Formula 1]

15. The display apparatus of claim 9, wherein at least one of the first and second wavelength conversion materials includes ceramic phosphor.

16. The display apparatus of claim 9, wherein at least one of the first and second wavelength conversion materials includes a quantum dot.

17. The display apparatus of claim 9, wherein the white light emitting device includes an edge type backlight unit including a light guide plate and LED light source modules.

18. The display apparatus of claim 17, wherein the LED light source modules are disposed on both opposing lateral surfaces of the light guide plate.

19. A display apparatus comprising:
a light emitting diode (LED) light source module which emits blue light; and
an image display panel which receives the blue light emitted from the LED light source module and which displays an image,
wherein the LED light source module includes a printed circuit board and the white light emitting device according to claim 9 mounted on the printed circuit board.

20. The display apparatus of claim 19 further comprising:
a backlight unit including a light guide plate and the LED light source module disposed on at least one lateral surface of the light guide plate; and
optical sheets disposed between the light guide plate and the image display panel.

* * * * *